US012592676B2

(12) United States Patent
Peng et al.

(10) Patent No.: US 12,592,676 B2
(45) Date of Patent: Mar. 31, 2026

(54) RESONATOR

(71) Applicant: TXC Corporation, Taipei City (TW)

(72) Inventors: Tzu-Hsiu Peng, Taoyuan City (TW);
Wei-Chen Lo, Taoyuan City (TW);
Zong-De Lin, Taoyuan City (TW)

(73) Assignee: TXC Corporation, Taipei City (TW)

( * ) Notice: Subject to any disclaimer, the term of this patent is extended or adjusted under 35 U.S.C. 154(b) by 806 days.

(21) Appl. No.: 17/987,884

(22) Filed: Nov. 16, 2022

(65) Prior Publication Data

US 2024/0048122 A1     Feb. 8, 2024

(30) Foreign Application Priority Data

Aug. 4, 2022   (TW) .................................. 111129294

(51) Int. Cl.
*H03H 9/17*          (2006.01)
*H03H 9/05*          (2006.01)
*H03H 9/13*          (2006.01)

(52) U.S. Cl.
CPC .......... *H03H 9/178* (2013.01); *H03H 9/0552* (2013.01); *H03H 9/131* (2013.01)

(58) Field of Classification Search
CPC .... H03H 9/178; H03H 9/02552; H03H 9/131; H03H 9/1021
USPC ........................................................ 310/348
See application file for complete search history.

(56) References Cited

U.S. PATENT DOCUMENTS

| | | | |
|---|---|---|---|
| 2009/0066191 A1* | 3/2009 | Tsuchido ............. | H03H 9/0595 29/25.35 |
| 2012/0176004 A1* | 7/2012 | Mizusawa ............ | H03H 9/0595 310/348 |
| 2021/0099156 A1 | 4/2021 | Kirkendall et al. | |
| 2021/0384882 A1 | 12/2021 | Goto | |

(Continued)

FOREIGN PATENT DOCUMENTS

| | | |
|---|---|---|
| CN | 107404304 | 11/2017 |
| JP | 2003110388 | 4/2003 |
| JP | 2007325250 | 12/2007 |

(Continued)

OTHER PUBLICATIONS

"Office Action of Japan Counterpart Application", issued on Feb. 16, 2024, p. 1-p. 4.

(Continued)

*Primary Examiner* — Derek J Rosenau
(74) *Attorney, Agent, or Firm* — JCIPRNET

(57) ABSTRACT

A resonator including a vibration structure, a first electrode, and a second electrode is provided. The vibration structure includes a vibration region, a protrusion portion, an opening, and a frame portion. The vibration region has a first surface and a second surface opposite to the first surface. The protrusion portion surrounds the vibration region. The opening is disposed at a side of the vibration region and between the vibration region and the protrusion portion. The opening has a first side adjacent to the vibration region and a second side far away from the vibration region. The second side is opposite to the first side. A length of the first side is greater than a length of the second side. The frame portion surrounds the protrusion portion. The first electrode is disposed on the first surface. The second electrode is disposed on the second surface.

14 Claims, 5 Drawing Sheets

(56) References Cited

U.S. PATENT DOCUMENTS

2022/0209749 A1    6/2022  Wang et al.

FOREIGN PATENT DOCUMENTS

| JP | 2009130672 | 6/2009 |
|----|------------|--------|
| JP | 2012065000 | 3/2012 |
| JP | 2012186639 | 9/2012 |
| TW | 201724587  | 7/2017 |

OTHER PUBLICATIONS

"Office Action of Taiwan Counterpart Application", issued on Mar. 6, 2023, p. 1-p. 9.

* cited by examiner

RESONATOR

CROSS-REFERENCE TO RELATED APPLICATION

This application claims the priority benefit of Taiwan application serial no. 111129294, filed on Aug. 4, 2022. The entirety of the above-mentioned patent application is hereby incorporated by reference herein and made a part of this specification.

BACKGROUND

Technical Field

The disclosure relates to an electronic component, and more particularly, to a resonator.

Description of Related Art

A resonator is an electronic component that utilizes piezoelectric properties of materials and natural resonance frequencies of the materials. Quartz crystal is a common material used for the resonator. When a spectral resonator is manufactured, a quartz wafer is usually cut into multiple quartz chips. For example, a laser is used for cutting.

However, when the laser heats and cuts the quartz wafer, it is easy to convert the single-crystal quartz material into the twin or polycrystalline quartz material, thereby affecting natural resonance frequencies of the quartz resonator.

On the other hand, when a vibration structure of the quartz chip is dispensed and fixed to a base, stress transmitted to the vibration region at a dispensing position will also affect vibration characteristics of the chip.

Therefore, how to reduce the twin or polycrystalline phenomenon caused by the laser cutting of the wafer and the influence of the stress transmitted to the vibration region at the dispensing position on the vibration characteristics of the chip is one of the important research and development topics in the art.

SUMMARY

The disclosure provides a resonator having good vibration characteristics.

An embodiment of the disclosure provides a resonator including a vibration structure, a first electrode, and a second electrode. The vibration structure includes a vibration region, a protrusion portion, an opening, and a frame portion. The vibration region has a first surface and a second surface opposite to the first surface. The protrusion portion surrounds the vibration region. The opening is disposed at a side of the vibration region and between the vibration region and the protrusion portion. The opening has a first side adjacent to the vibration region and a second side far away from the vibration region. The second side is opposite to the first side. A length of the first side is greater than a length of the second side. The frame portion surrounds the protrusion portion. The first electrode is disposed on the first surface, and the second electrode is disposed on the second surface.

In the resonator according to the embodiment of the disclosure, the opening is between the vibration region and the protrusion portion of the vibration structure, and the length of the first side of the opening adjacent to the vibration region is greater than the length of the second side far away from the vibration region. Therefore, when the protrusion portion is dispensed and fixed on the base, the opening may isolate the stress transmitted to the vibration region at a dispensing position, so as to optimize the vibration characteristics of the vibration region. In addition, in the resonator according to the embodiment of the disclosure, a periphery of the protrusion portion of the vibration structure has the frame portion, and the frame portion may be used for laser cutting, so as to retain a twin or polycrystalline phenomenon on the frame portion without affecting the vibration region. Therefore, the resonator in the embodiment of the disclosure has the good vibration characteristics.

DETAILED DESCRIPTION OF DISCLOSED EMBODIMENTS

Figure 1A:
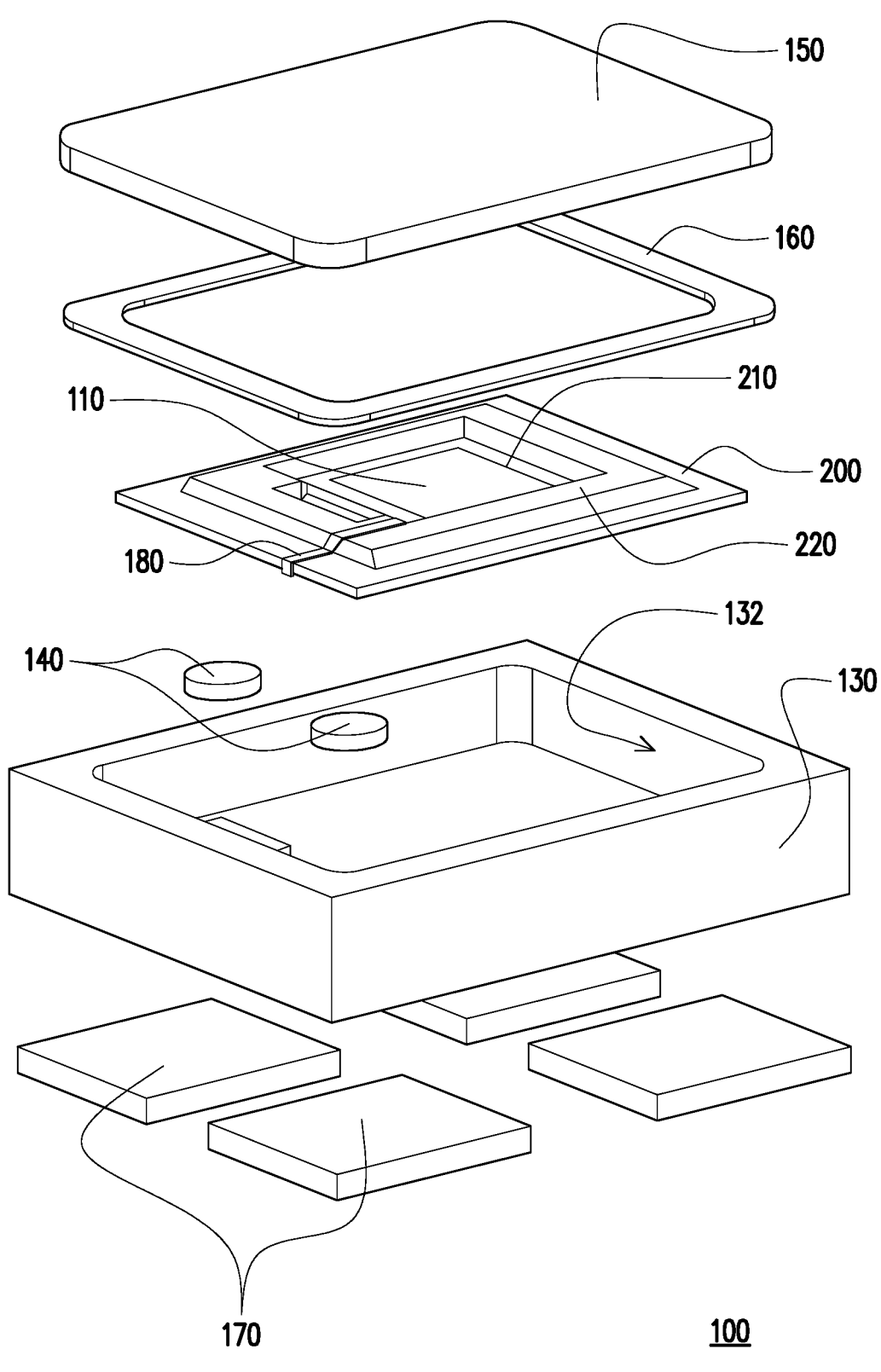
FIG. 1A is a schematic exploded view of a resonator according to an embodiment of the disclosure.
Figure 1B:
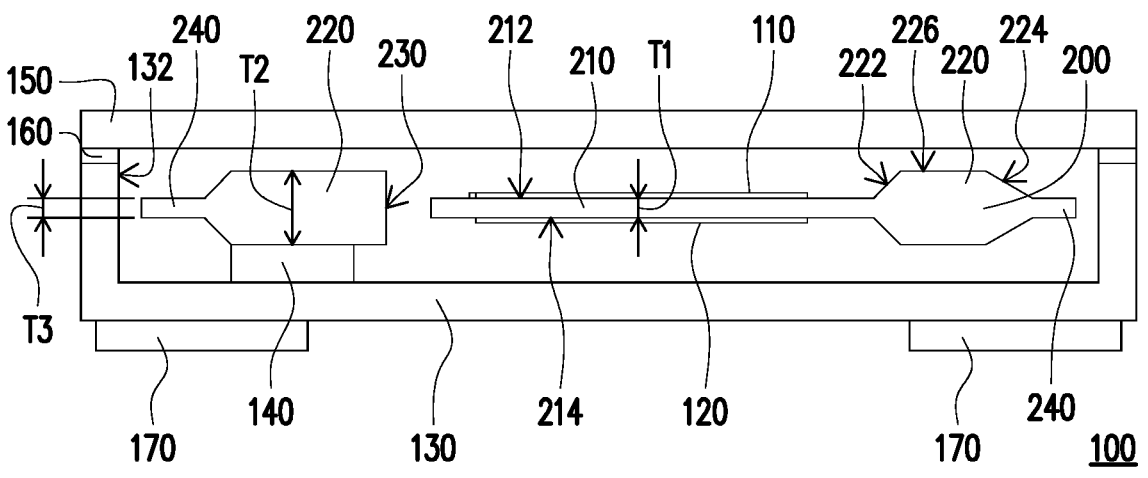
FIG. 1B is a schematic cross-sectional view of the resonator in FIG. 1A.
Figure 2A:
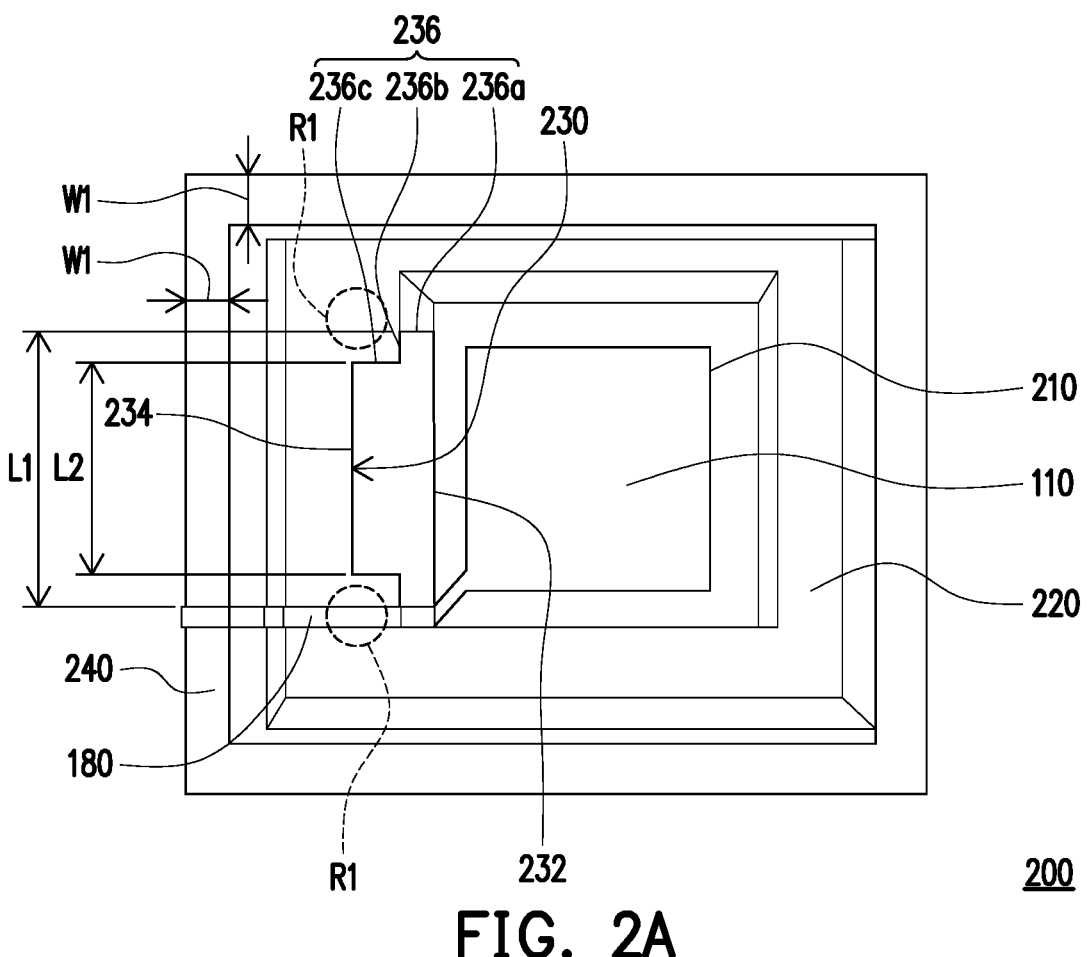
FIG. 2A is a schematic top view of a vibration structure in FIG. 1A.
Figure 2B:
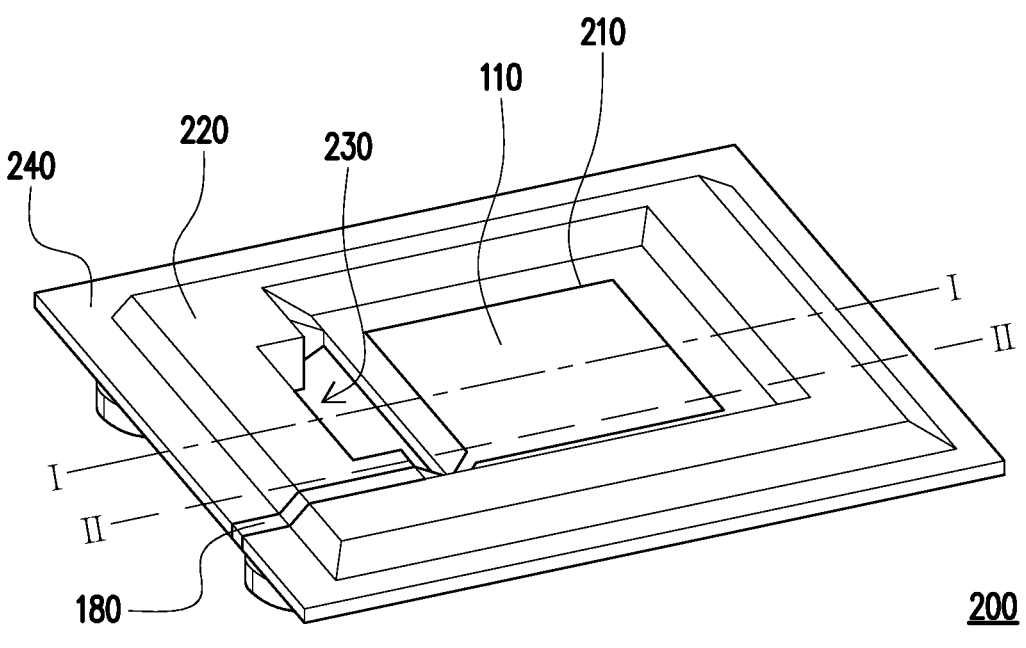
FIG. 2B is a schematic perspective view of the vibration structure in FIG. 2A.
Figure 2C:
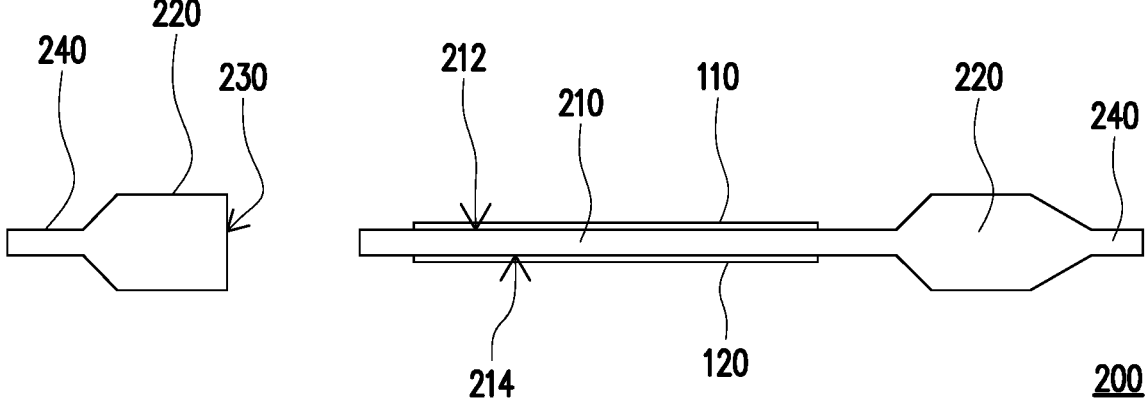
FIG. 2C is a schematic cross-sectional view of the vibration structure in FIG. 2B taken along a line I-I.

FIG. 1A is a schematic exploded view of a resonator according to an embodiment of the disclosure. FIG. 1B is a schematic cross-sectional view of the resonator in FIG. 1A. FIG. 2A is a schematic top view of a vibration structure in FIG. 1A. FIG. 2B is a schematic perspective view of the vibration structure in FIG. 2A. FIG. 2C is a schematic cross-sectional view of the vibration structure in FIG. 2B taken along a line I-I, while a schematic cross-sectional view of a vibration structure in FIG. 1B is a schematic cross-sectional view taken along a line II-II in FIG. 2B. Referring to FIGS. 1A, 1B, and 2A to 2C, a resonator 100 in this embodiment includes a vibration structure 200, a first electrode 110, and a second electrode 120. In this embodiment, a material of the vibration structure 200 is a piezoelectric material, such as quartz crystal or other piezoelectric materials.

The vibration structure 200 includes a vibration region 210, a protrusion portion 220, an opening 230, and a frame portion 240. The vibration region 210 has a first surface 212 and a second surface 214 opposite to the first surface 212. The first electrode 110 is disposed on the first surface 212, and the second electrode 120 is disposed on the second surface 214. A region between the first electrode 110 and the second electrode 120 is the vibration region 210. When a voltage difference is applied between the first electrode 110 and the second electrode 120, the vibration region 210 is deformed due to an inverse piezoelectric effect. Then when the voltage difference is removed, the vibration region 210 vibrates, and due to a piezoelectric effect, a voltage change is generated between the first electrode 110 and the second electrode 120 along with the vibration, so that the first electrode 110 and the second electrode 120 output a voltage signal. The vibration region 210 is, for example, in a shape of a flat plate, and the first electrode 110 and the second electrode 120 may be electrode layers disposed on the two opposite surfaces of the flat vibration region 210.

In addition, the protrusion portion 220 surrounds the vibration region 210, and the opening 230 is disposed at a side of the vibration region 210 and between the vibration region 210 and the protrusion portion 220. The opening 230 has a first side 232 adjacent to the vibration region 210 and a second side 234 far away from the vibration region 210. The second side 234 is opposite to the first side 232, and a length L1 of the first side 232 is greater than a length L2 of the second side 234. In addition, the frame portion 240 surrounds the protrusion portion 220. In this embodiment, a thickness T3 of the frame portion 240 is less than a thickness T2 of the protrusion portion 220, and a thickness T1 of the vibration region 210 is less than the thickness T2 of the protrusion portion 220. When the vibration structure 200 is manufactured, the vibration structures 200 arranged in an array may be formed on a wafer (e.g., a quartz wafer). Each of the vibration structures 200 includes the vibration region 210, the protrusion portion 220, and the frame portion 240, and the frame portions 240 of the adjacent vibration structures 200 are connected to each other. Next, the frame portion 240 is cut with a laser to cut the originally connected vibration structures 200 into the separate and independent vibration structures 200.

In this embodiment, the resonator 100 further includes a base 130 and at least one adhesive 140 (in which two adhesives are taken as an example in FIG. 1A). The vibration structure 200 is disposed on the base 130. In this embodiment, the base 130 has a recess 132, and the vibration structure 200 is disposed in the recess 132. In addition, in this embodiment, the resonator 100 further includes an upper cover 150 disposed on the base 130 and covering the vibration structure 200. In this embodiment, the upper cover 150 may be disposed on the base 130 through a seal ring 160.

The adhesive 140 adheres to the protrusion portion 220 and the base 130, and is disposed beside the opening 230 to fix the vibration structure 200 on the base 130. In this embodiment, the two adhesives 140 are respectively disposed beside two ends of the opening 230, for example, disposed on a backside of a region R1 in FIG. 2A.

In the resonator 100 in this embodiment, the opening 230 is between the vibration region 210 and the protrusion portion 220 of the vibration structure 200, and the length L1 of the first side 232 of the opening 230 adjacent to the vibration region 210 is greater than the length L2 of the second side 234 far away from the vibration region 210. Therefore, when the protrusion portion 220 is fixed on the base 130 through the adhesive 140, the opening 230 may isolate stress transmitted to the vibration region 210 at a fixed position (i.e., the region R1), so as to optimize vibration characteristics of the vibration region 210. In this embodiment, the opening 230 further includes two opposite stepped short sides 236 connected to the first side 232 and the second side 234. Each of the stepped short sides 236 includes a sub-side 236a, a sub-side 236b, and a sub-side 236c, and the sub-side 236a, the sub-side 236b, and the sub-side 236c are sequentially connected between the first side 232 and the second side 234 in a bent shape to form a stepped shape.

In addition, in the resonator 100 in this embodiment, a periphery of the protrusion portion 220 of the vibration structure 200 has the frame portion 240. The frame portion 240 may be used for laser cutting, so as to retain a twin or polycrystalline phenomenon caused by the laser cutting on the frame portion 240 without affecting the vibration region 210. That is, the vibration region 210 is maintained in a single-crystal state without affecting a natural resonance frequency thereof. Therefore, the resonator 100 in this embodiment has the good vibration characteristics. In addition, in a design that the thickness T3 of the frame portion 240 is less than the thickness T2 of the protrusion portion 220, it may also be expected to use a lower laser power to cut the frame portion 240, so as to reduce a twin range caused by the laser cutting and an influence on the vibration region 210. In addition, a design that the thickness T2 of the protrusion portion 220 is greater than the thickness T3 of the frame portion 240 helps to isolate heat generated by the laser cutting at the periphery of the protrusion portion 220, so as to protect the vibration region 210 from the twin or polycrystalline phenomenon. In an embodiment, the thickness T3 of the frame portion 240 may be equal to the thickness T1 of the vibration region 210. In this embodiment, a ratio of a width W1 of the frame portion 240 to the thickness T1 of the vibration region 210 is greater than 0.1 and less than 10. Such a design may enable the twin or polycrystalline phenomenon generated by the laser cutting of the frame portion 240 to be retained on the frame portion 240 without affecting the vibration region 210.

In this embodiment, the protrusion portion 220 has an inner bevel 222 adjacent to the vibration region 210, an outer bevel 224 far away from the vibration region 210, and a top surface 226 connected to the inner bevel 222 and the outer bevel 224. In this embodiment, both the inner bevel 222 and the outer bevel 224 are inclined relative to an extending direction of the vibration region 210, and the top surface 226 may be parallel to the extending direction of the vibration region 210. In this embodiment, the protrusion portion 220 may protrude upward and downward relative to the vibration region 210. Therefore, upper and lower sides of the protrusion portion 220 may both have the inner bevel 222, the outer bevel 224, and the top surface 226.

In this embodiment, the resonator 100 further includes multiple pads 170 disposed below the base 130. The pads 170 may be electrically connected to the first electrode 110 and the second electrode 120 through a conductive trace 180, respectively. In this way, an external voltage may be applied to the pads 170, and an output voltage change of the pads may be sensed.

Figures 3A, 3B:
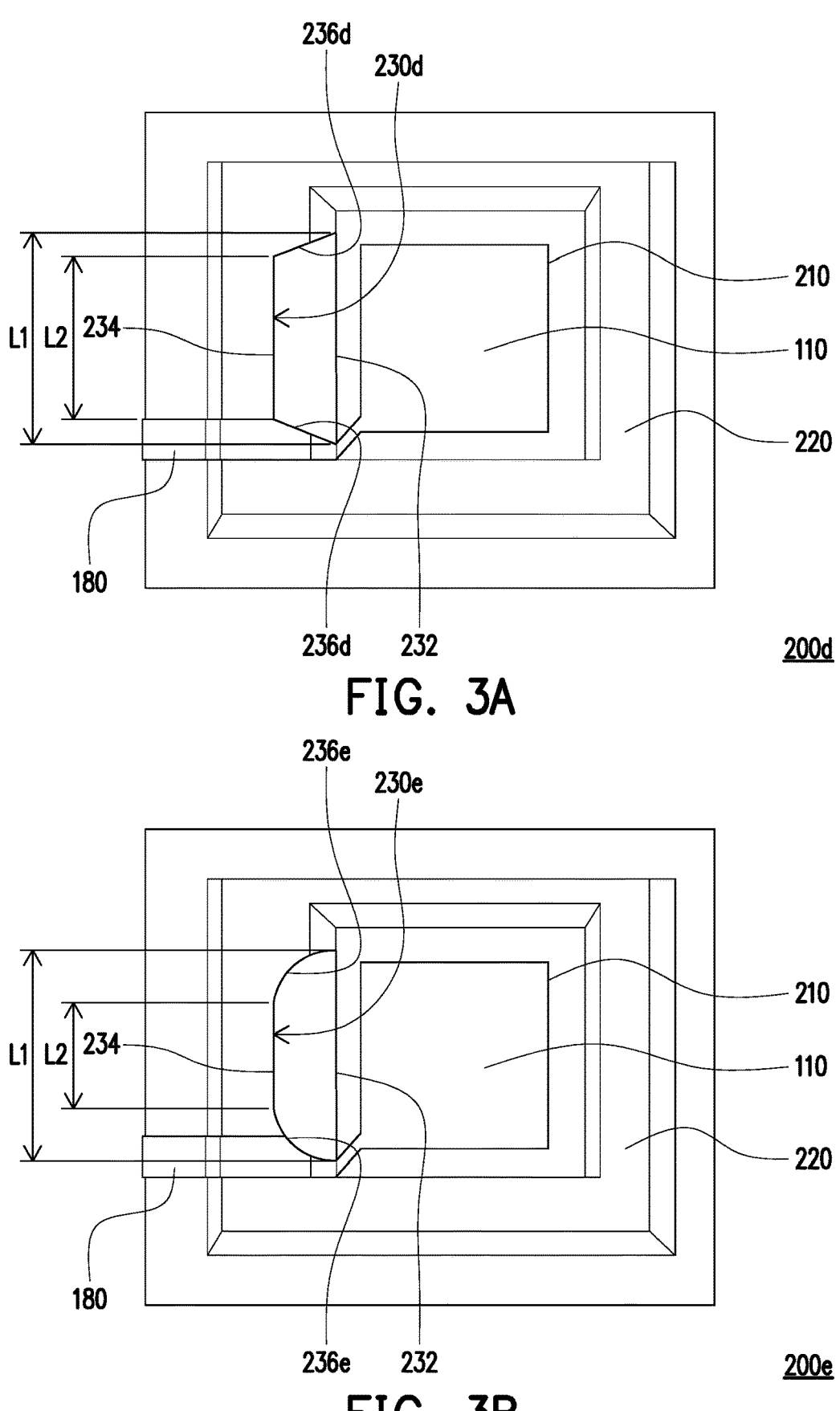
FIGS. 3A and 3B are schematic top views of vibration structures of resonators according to another two embodiments of the disclosure.

FIGS. 3A and 3B are schematic top views of vibration structures of resonators according to another two embodiments of the disclosure. Referring to FIGS. 3A and 3B, a vibration structure 200d in the embodiment of FIG. 3A and a vibration structure 200e in FIG. 3B are similar to the vibration structure 200 in FIG. 2C, and differences are as follows. In the embodiment of FIG. 3A, an opening 230d includes two opposite short beveled sides 236d connected to the first side 232 and the second side 234. In this embodiment, the short beveled sides 236d are inclined relative to the first side 232 and the second side 234. In the embodiment of FIG. 3B, an opening 230e includes two opposite arcuate short sides 236e connected to the first side 232 and the second side 234.

Figure 4:
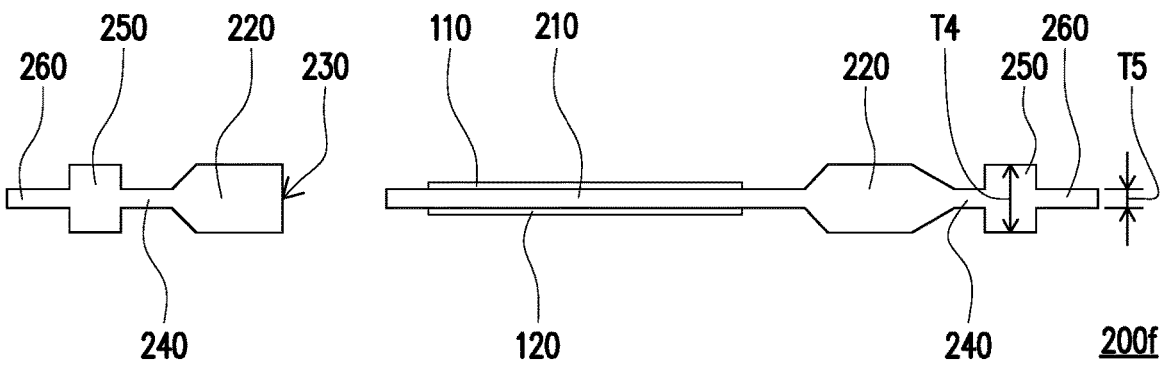
FIG. 4 is a schematic cross-sectional view of a vibration structure of a resonator according to still another embodiment of the disclosure.

FIG. 4 is a schematic cross-sectional view of a vibration structure of a resonator according to still another embodiment of the disclosure. Referring to FIG. 4, a vibration structure 200f in this embodiment is similar to the vibration structure 200 in FIG. 2C, and differences between the two are as follows. Compared to the vibration structure 200 in FIG. 2C, the vibration structure 200f in this embodiment further includes another protrusion portion 250 and another frame portion 260. The protrusion portion 250 surrounds the frame portion 240, and the frame portion 260 surrounds the protrusion portion 250. A design of the another protrusion portion 250 and the another frame portion 260 may enable a cutting position of the laser to fall on the frame portion 260. In this way, the frame portion 260 cut by the laser is farther away from the vibration region 210, and the twin or polycrystalline phenomenon caused by the laser cutting may be further retained on the frame portion 260 without affecting the vibration region 210. In other embodiments, the number of the another protrusion portions 250 and the another frame portions 260 may be more than one. For example, the number of the another protrusion portions 250 may be more than two, while the number of the another frame portions 260 may be more than two. That is, there may be more than two pairs of the protrusion portions 250 and the frame portions 260. The innermost protrusion portion 250 surrounds the frame portion 240, and the rear frame portion 260 and other protrusion portions 250 alternately surround the innermost protrusion portion 250. In this way, the cutting position of the laser may fall on the outermost frame portion 260, so that the frame portion 260 cut by the laser is farther away from the vibration region 210, and the twin or polycrystalline phenomenon caused by the laser cutting may be further retained on the frame portion 260 without affecting the vibration region 210. In this embodiment, a thickness T4 of the protrusion portion 250 is greater than a thickness T5 of the frame portion 260, which helps to isolate the heat generated by the laser cutting at a periphery of the protrusion portion 250, so as to protect the vibration region 210 from the twin or polycrystalline phenomenon.

It is worth mentioning that the thicknesses T1, T2, T3, T4, and T5 are the thicknesses in a direction perpendicular to the vibration region 210. The width W1 is the width in a direction parallel to the vibration region 210, and the lengths L1 and L2 are the lengths in the direction parallel to the vibration region 210.

Figure 5:
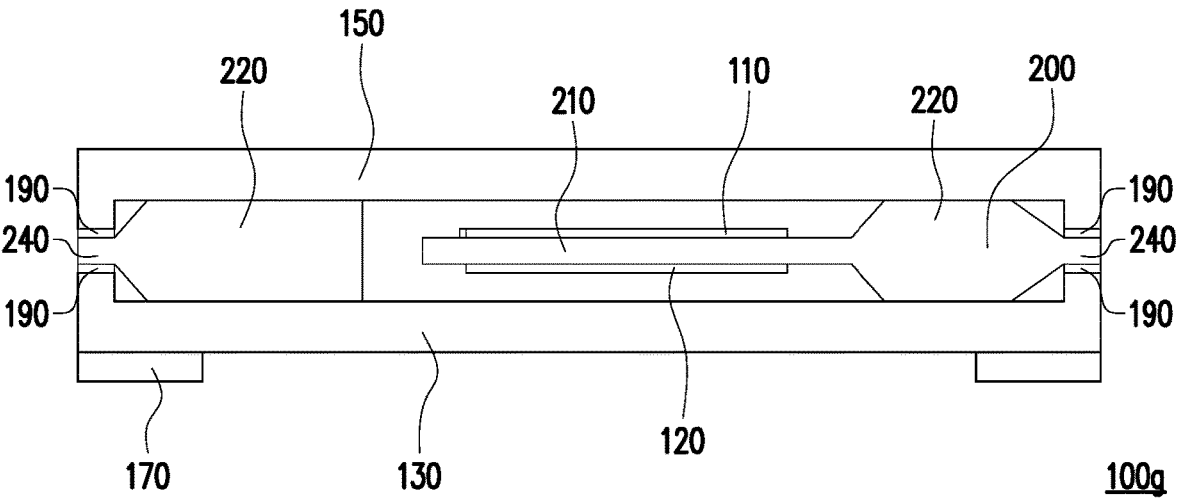
FIG. 5 is a schematic cross-sectional view of a resonator according to still another embodiment of the disclosure.

FIG. 5 is a schematic cross-sectional view of a resonator according to still another embodiment of the disclosure. Referring to FIG. 5, a resonator 100g in this embodiment is similar to the resonator 100 in FIG. 1B, and a difference between the two is that the vibration structure 200 in the resonator 100 in FIG. 1B is fixed on the base by adhering to the protrusion portion 220 and the base 130 through the adhesive 140, while in the resonator 100g in this embodiment, the frame portion 240 of the vibration structure 200 is sandwiched by an edge of the upper cover 150 and an edge of the base 130. In addition, the resonator 100g further includes an annular bonding layer 190 to bond the edge of the base 130 and the frame portion 240. In addition, the resonator 100g further includes another annular bonding layer 190 to bond the edge of the upper cover 150 and the frame portion 240. In this way, the vibration structure 200 may also be fixed on the base 130, and the vibration region 210 may vibrate.

Based on the above, in the resonator according to the embodiment of the disclosure, the opening is between the vibration region and the protrusion portion of the vibration structure, and the length of the first side of the opening adjacent to the vibration region is greater than the length of the second side far away from the vibration region. Therefore, when the protrusion portion is dispensed and fixed on the base, the opening may isolate the stress transmitted to the vibration region at a dispensing position, so as to optimize the vibration characteristics of the vibration region. In addition, in the resonator according to the embodiment of the disclosure, the periphery of the protrusion portion of the vibration structure has the frame portion, and the frame portion may be used for the laser cutting, so as to retain the twin or polycrystalline phenomenon on the frame portion without affecting the vibration region. Therefore, the resonator in the embodiment of the disclosure has the good vibration characteristics.

What is claimed is:

1. A resonator, comprising:
a vibration structure, comprising:
  a vibration region having a first surface and a second surface opposite to the first surface;
  a protrusion portion surrounding the vibration region;
  an opening disposed at a side of the vibration region and between the vibration region and the protrusion portion, wherein the opening has a first side adjacent to the vibration region and a second side far away from the vibration region, the second side is opposite to the first side, and a length of the first side is greater than a length of the second side; and
  a frame portion surrounding the protrusion portion;
a first electrode disposed on the first surface; and
a second electrode disposed on the second surface.

2. The resonator according to claim 1, wherein a thickness of the frame portion is less than a thickness of the protrusion portion, and a thickness of the vibration region is less than the thickness of the protrusion portion.

3. The resonator according to claim 2, wherein a ratio of a width of the frame portion to the thickness of the vibration region is greater than 0.1 and less than 10.

4. The resonator according to claim 1, wherein the opening further comprises two opposite stepped short sides connected to the first side and the second side.

5. The resonator according to claim 1, wherein the opening further comprises two opposite short beveled sides connected to the first side and the second side.

6. The resonator according to claim 1, wherein the opening further comprises two opposite arcuate short sides connected to the first side and the second side.

7. The resonator according to claim 1, further comprising:
a base, wherein the vibration structure is disposed on the base; and
at least one adhesive adhering to the protrusion portion and the base, and disposed beside the opening.

8. The resonator according to claim 7, wherein the at least one adhesive comprises two adhesives respectively disposed beside two ends of the opening.

9. The resonator according to claim 7, wherein the base has a recess, and the vibration structure is disposed in the recess.

10. The resonator according to claim 9, further comprising an upper cover disposed on the base and covering the vibration structure.

11. The resonator according to claim 1, wherein a material of the vibration structure is a piezoelectric material.

12. The resonator according to claim 1, wherein the vibration structure further comprises:
another protrusion portion surrounding the frame portion; and
another frame portion surrounding the another protrusion portion.

13. The resonator according to claim 1, wherein the protrusion portion has an inner bevel adjacent to the vibration region, an outer bevel far away from the vibration region, and a top surface connected to the inner bevel and the outer bevel.

14. The resonator according to claim 1, further comprising:

a base;

an upper cover, wherein the frame portion of the vibration structure is sandwiched by an edge of the upper cover and an edge of the base;

an annular bonding layer bonding the edge of the base and the frame portion; and another annular bonding layer bonding the edge of the upper cover and the frame portion.

5

* * * * *